United States Patent [19]

Benedict et al.

[11] Patent Number: 5,644,470

[45] Date of Patent: Jul. 1, 1997

[54] AUTODOCKING HARDWARE FOR INSTALLING AND/OR REMOVING ADAPTER CARDS WITHOUT OPENING THE COMPUTER SYSTEM COVER

[75] Inventors: Melvin Kent Benedict, Cary, N.C.; Patrick Allen Buckland, Austin, Tex.; Richard Allen Kelley, Apex, N.C.; Danny Marvin Neal, Round Rock, Tex.; Price Ward Oman, Raleigh; Carl Raymond Waters, Cary, both of N.C.

[73] Assignee: International Business Machines Corporation, Armonk, N.Y.

[21] Appl. No.: 552,186

[22] Filed: Nov. 2, 1995

[51] Int. Cl.$^6$ .................. G06F 1/16; H01R 13/629; H05K 7/10
[52] U.S. Cl. .................. 361/686; 361/798; 439/160
[58] Field of Search .................. 439/64, 152, 153, 439/155, 157, 160, 342, 377; 361/683, 684–686, 732, 740, 741, 747, 754, 756, 759, 798, 801, 802; 364/708.1

[56] References Cited

U.S. PATENT DOCUMENTS

| | | | |
|---|---|---|---|
| 5,113,317 | 5/1992 | Howe | 361/756 X |
| 5,238,423 | 8/1993 | Hillis et al. | 439/377 X |
| 5,289,339 | 2/1994 | Akashi et al. | 361/684 |

*Primary Examiner*—Michael W. Phillips
*Attorney, Agent, or Firm*—Mark E. McBurney

[57] ABSTRACT

A computer system is provided which allows a user to remove or install feature cards without removing the cover to entire computer. A computer cover is provided with rectangular openings which correspond in alignment and size to an electrical connector on the system board. The feature card can then be mechanically attached to the computer cover, or a frame member, with a pivot and guide member. A handle is provided which will allow the user to apply pressure to the card, via the guide member in order to insert or remove the feature card from the connector on the system board. The guide member is constructed such that a vertical force is applied between the card and connector to ensure proper alignment when inserting and removing the adapter card.

7 Claims, 11 Drawing Sheets

AUTODOCKING HARDWARE FOR INSTALLING AND/OR REMOVING ADAPTER CARDS WITHOUT OPENING THE COMPUTER SYSTEM COVER

CROSS REFERENCE TO RELATED APPLICATIONS

"ERROR RECOVERY BY ISOLATION OF PERIPHERAL COMPONENTS IN A DATA PROCESSING SYSTEM", filed Nov. 2, 1995, Ser. No. 08/556,887, assigned to the assignee of the subject application.

"ADAPTER CARD SLOT ISOLATION FOR HOT PLUGGING", filed Nov. 2, 1995, Ser. No. 08/552,035, assigned to the assignee of the subject application.

BACKGROUND OF THE INVENTION

1. Technical Field

The present invention generally relates to removing and installing adapter, or feature cards in a computer system. More specifically, a system is disclosed which allows changing the adapter cards in the computer system without having to remove the cover from the entire computer.

2. Description of Related Art

Typical computer systems include a system board which includes a microprocessor and other application specific integrated circuits (ASIC), such as memory controllers, input/output (I/O) controllers, and the like, electrically connected to one another by wiring layers. Also, most computers include slots for additional adapter cards which can connect the chips on the cards to the microprocessor and/or other chips on the system board, to provide additional function to the computer system. Typical functions that a user might add to a computer include additional memory, fax/modem capability, sound cards, graphics cards or the like. The slots included on the system board generally include in-line electrical connectors having electrically conductive lands which receive exposed tabs on the adapter cards. The I/Os of the chips on the cards are connected to the tabs. The connector is then electrically connected to the microprocessor, or the like through the previously mentioned wiring layers.

In conventional computer systems, a user must power off the system and first remove the cover from the entire computer system before the additional card(s) can be accessed. This is true whether an existing card is being removed and/or a new card is being added to the computer. Often, it is a time consuming operation to remove and replace the cover of the computer system. Several metal screws must be removed and then reinstalled, and the cover frequently requires very precise alignment before it seats on the computer frame. Also, the actual installation of the card into the adapter slot can be a painstaking and time consuming operation, since the user is required to precisely align the card and slot, without the aid of any type of alignment device, and exert sufficient (but not too much) pressure for electrical contact to be made, without damaging the card or connector.

Therefore, it can be seen that a need exists for a computer system which would allow a user to change the hardware configuration of a computer by removing a feature card from and/or installing a feature card into a computer system without the need of removing the actual cover from the computer system. Additionally, a system would be advantageous that would assist the user in aligning the card and connector to ensure proper electrical connection and avoid damage to either component.

SUMMARY OF THE INVENTION

In contrast to the prior art, the present invention provides a computer system which allows a user to remove or install feature cards (i.e. change the hardware configuration of the computer) without removing the cover of the entire computer system.

Broadly, a computer cover is provided with substantially rectangular openings which correspond in alignment to an electrical connector on the system board. The adapter card can then be mechanically attached to the computer with the aid of a pivot and guide member. A handle is provided which will allow the user to apply pressure to the card, via the guide member in order to insert or remove the feature card from the connector on the system board. The guide member is constructed such that a vertical force is applied between the card and connector to ensure proper alignment when inserting and removing the adapter card.

In accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
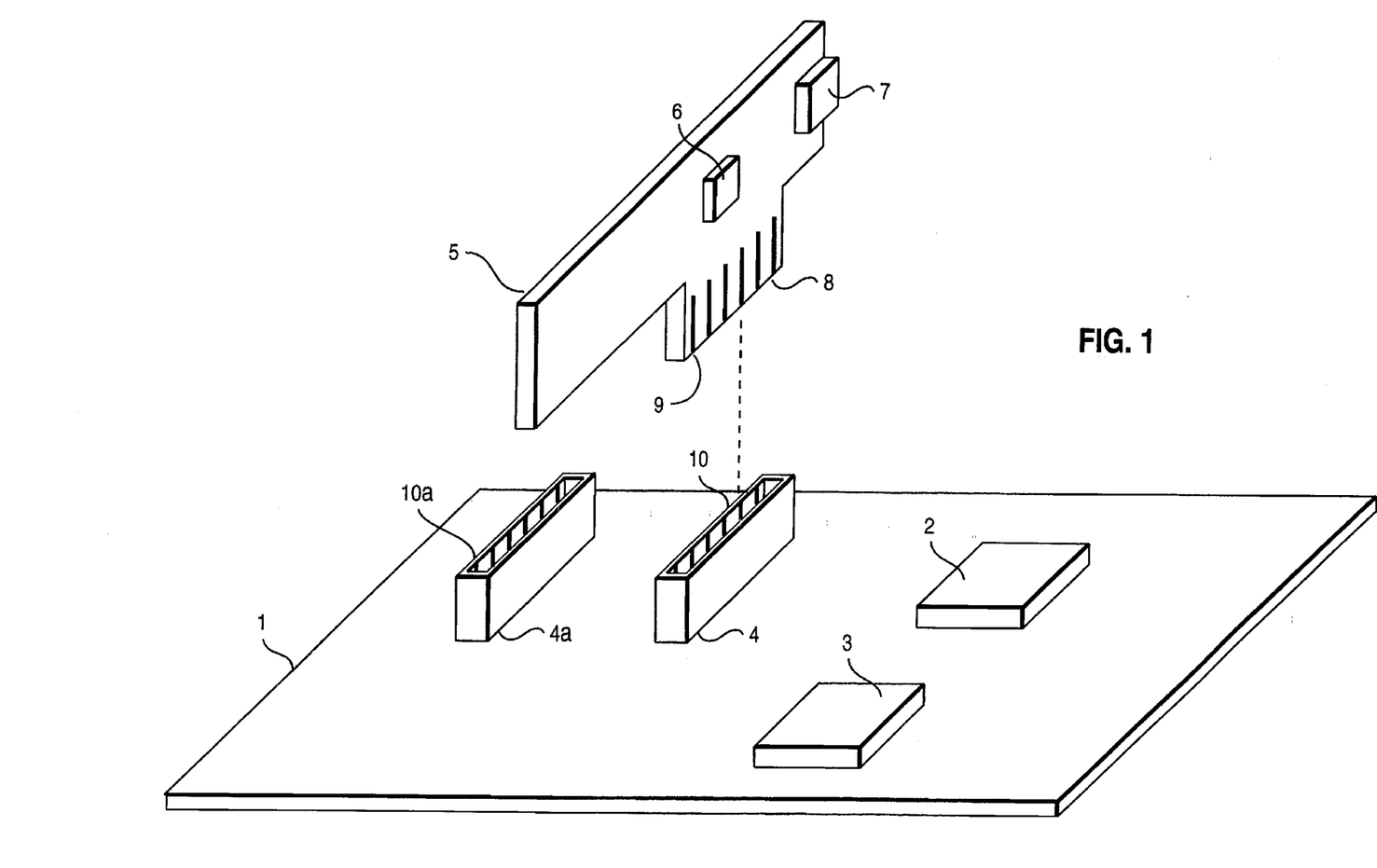
FIG. 1 is a perspective view of a system board and an adapter card, and the mechanical relationship therebetween.

Referring to FIG. 1, a perspective view of a system board 1 and feature, or adapter, card 5 is shown. Board 1 includes various integrated circuit chips such as a microprocessor 2, e.g. a PowerPC microprocessor available from the IBM Corporation (PowerPC is a trademark of IBM) and other application specific integrated circuits 3, such as a memory, I/O controller or the like. In line connectors 4 and 4a are also shown attached to system board 1. These connectors are electrically connected to the ICs on board 1 through wiring layers which are present in the system board. Electrically conductive lands 10 and 10a are present in connectors 4 and 4a which will interconnect with electrically conductive tabs on a feature card. The feature card 5, also known as device 5, is shown perspectively and includes an interconnection portion 8 having conductive tabs 9 therein. These tabs 9 will contact lands 10 in connector 4 such that electrical connection can then be made between the various components on system board 1 and the chips present on feature card 5. Chips 6 and 7 on feature card 5 could be any one of a number of integrated circuits that will provide additional function to the computer system. For example, these chips 6 and 7 may be memory, graphics accelerator, math co-processor, modem, or the like ICs. Again, there are wiring layers present in feature card 5 which will connect chips 6 and 7 on feature card 5 with microprocessor 2 and chip 3 on the system board when card 5 is inserted into connector 4. Those skilled in the art will understand that card 5 and system board 1 can be any one of a number of substrates, which include layers of electrically conductive, and alternating insulating material, connected to one another through vias. The layers in board 1 and card 5 are brought out to surface pads and then connected to the I/O points on the various chips by using one of the many interconnection methods, such as controlled collapse chip connect (C4), solder ball connect (SBC) wire bonding, surface mount technology (SMT) or the like.

Figure 2:
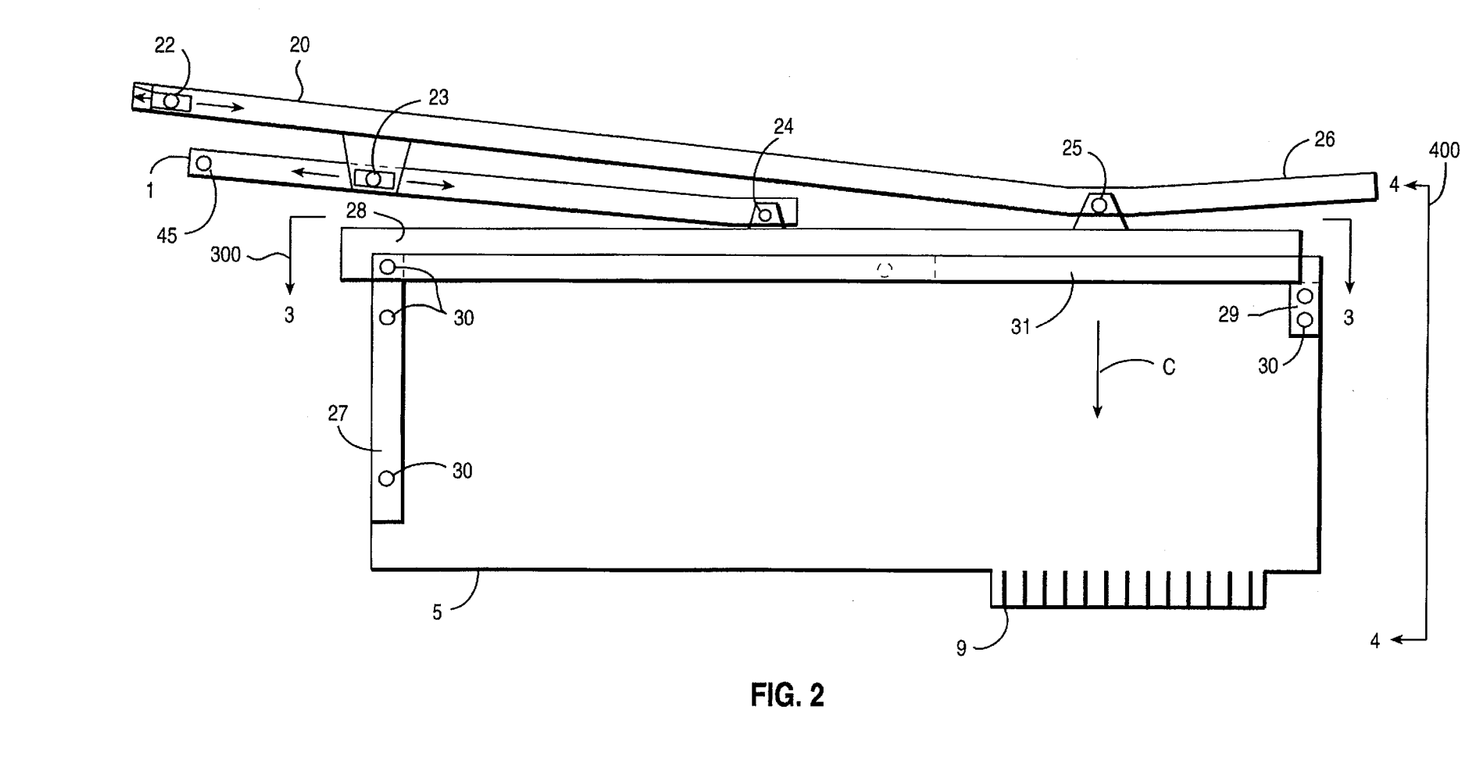
FIG. 2 is an elevation view of an adapter card with a corresponding attached guide member.

FIG. 2 shows a preferred embodiment of the guiding means of the present invention. Adapter card 5 is shown having electrically conductive tabs 9 in the same manner as described with regard to FIG. 1. Additionally, a card guide 31 is shown which is affixed to card 5 by friction fit, clamping, screws, or other attachment means. It should be noted that guide 31 can be shortened, or otherwise modified to accommodate one-half sized adapter cards, which are common in the industry. The invention will be described using a full sized adapter card, but it should be understood that a half-size card is contemplated by the scope of the present invention. Guide 31 includes end portions 29 and 27 which are affixed to the ends of adapter card 5 by attachment means 30.

Figure 4:
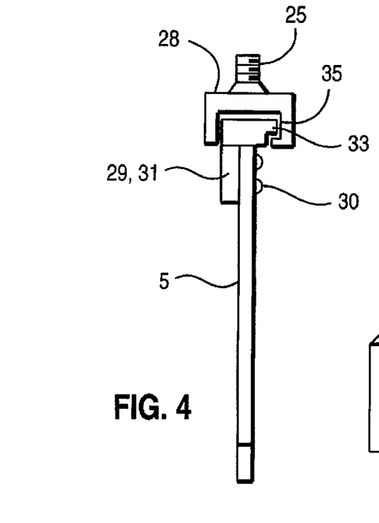
FIG. 4 is an elevation view of the adapter card and guide member of the present invention taken along section line B—B of FIG. 2.
Figure 5:
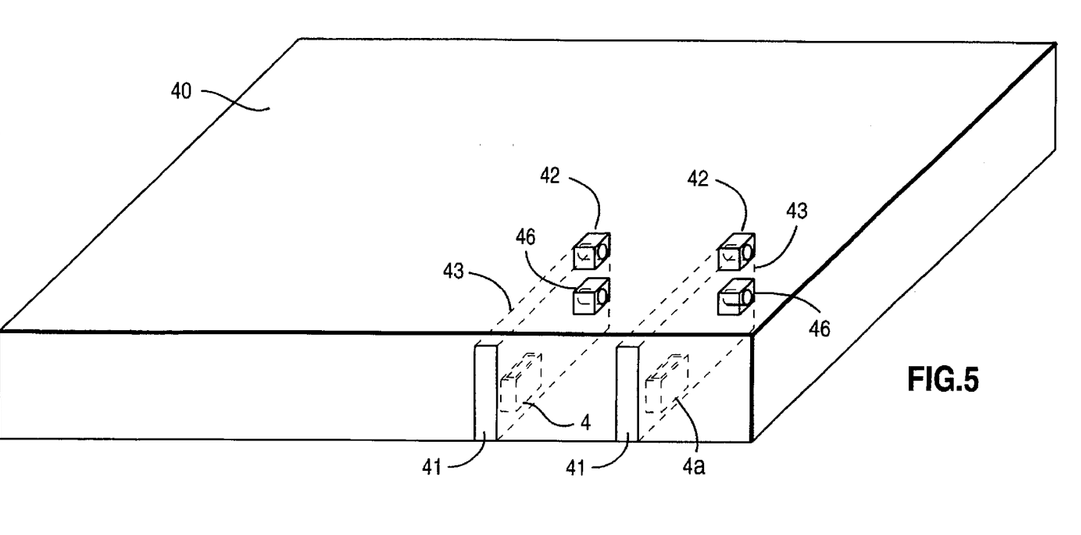
FIG. 5 is a perspective view of a computer system cover showing the slots which accommodate the adapter card and guide member of the present invention.

A guide rail 28 is provided which slidably receives the card guide 31, as shown in greater detail in FIG. 4. At least one shoulder portion 33 is included which fits, or conforms with the interior surface of guide rail 28 (see FIG. 4). Pivot points 24 and 25 are rigidly affixed to guide rail 28. Pivot 25 is also rotatingly attached to an elongated force transfer member 20 which has a lever portion 26 (see FIG. 2). A second force transfer member 21 is rotatingly attached at one end to pivot 24 and rotatingly attached, at substantially the other end, to a pivot 23 which is rigidly affixed to member 20. The end of force transfer member 20, opposite lever portion 26, is rotatingly attached to a pivot member 42 which is rigidly affixed to frame member 43, or the like, as shown in FIG. 5. It should be noted that pivot points 22 and 23 also include a slotted opening about pivot pins inserted therein to provide some sliding movement (in the directions shown by the arrows in FIG. 2) as card 5 is removed from, or inserted into, connector 4 by raising or lowering the card.

It can be seen that the arrangement of FIG. 2 provides downward vertical motion of card 5, as shown by arrow C, such that electrical tabs 9 will seat and connect with in-line connector 4 of FIG. 1. Those skilled in the art will understand that if card 5 were directly attached to a pivot, then tabs 9 would approach connector 4 at an angle and it would be extremely difficult to insert card 5 into connector 4 and make reliable mechanical and electrical connection.

As shown in FIG. 2, when force in exerted upwardly on lever 26 to disengage an adapter card, there is an upward vertical force at pivot 25, which is directly transferred to card 5 at a point in alignment with electrical connection tabs 9. At the same time, an upward force is applied to member 21 through pivot 23 and transferred to card 5 at pivot point 24. This provides a slight upward force on card 5, which prevents it from rotating as the card is removed from connector 4 and allowing the card to become easily decoupled from the connector, both electrically and mechanically. The process is reversed when it is desired to insert a card 5 into a connector 4 on system board 1. After guide 31 is attached to card 5, it is slid into guide rail 28. Downward force is then applied to lever 26 and this force is transferred to card 5 through pivot 25. Since pivot 25 is aligned with tabs 9, this downward force is exerted vertically and directly on the connection tabs. The downward force on lever 26, also provides a downward force on member 21 via pivot 23. This force is then transferred as a slight downward force to card 5 through pivot 24 to prevent the adapter card from rotating as it approaches connecter 4. Thus, as described above, it can be seen how the apparatus of FIG. 2, allows an adapter card to be vertically inserted and removed from an in-line connector resident on a computer system board. The previous description is one preferred embodiment of the present invention, however, those skilled in the art will readily comprehend how other mechanisms, such as cam gears and the like could be used to provide an apparatus that would allow vertical insertion and removal of an adapter card from a connector.

Figure 3:
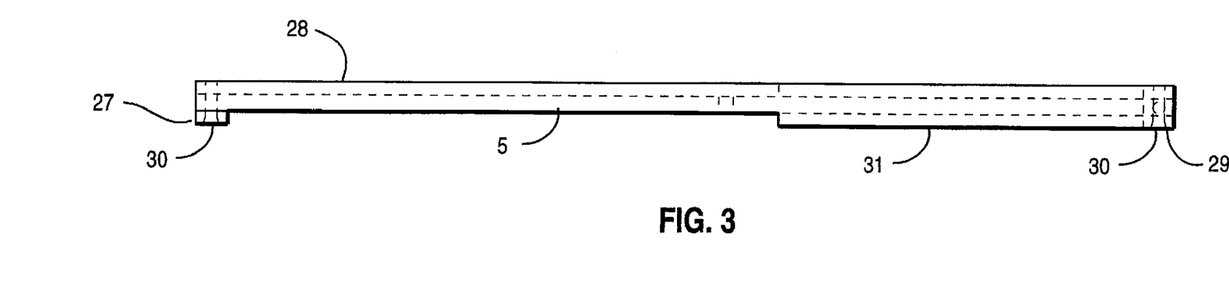
FIG. 3 is a top view taken along section line A—A of FIG. 2 of the adapter card and guide member of the present invention.

FIG. 3 is a view of card 5, taken along line 3—3, 300 of FIG. 2 showing how guide member 31, along with portions 27 and 29 are attached to the card using attachment means, such as screws 30, or the like. FIG. 4 is a side view of card 5, taken along line 4—4, 400 of FIG. 2. This view shows guide member 31 with its end portion 29 and attachment means 30. As noted above, the shoulder portion 33 of guide member 31 conforms to the interior surface 35 of guide rail 28 such that guide 31, with card 5 attached thereto, can be longitudinally inserted into guide rail 28 in a slidable disposition. Pivot means 25 is also shown in FIG. 4 and affixed to guide rail 28 in the same manner as shown in FIG. 2.

FIG. 5 is a perspective view of a computer system having a cover 40 with slots 41 formed therein. Two slots 41 are shown in FIG. 5. However, it is contemplated that any number of slots 41 can be formed in cover 40 in order to accommodate the desired number of adapter cards 5. A frame member 43 is shown which is affixed to a system board 1 (or another suitable support) internal to the computer. Pivot means 42 are also shown disposed on frame member 43 and which are rotatingly attached to pivot point 22 of the guide means of FIG. 2. Also, pivot point 45 is rotatingly attached to frame member 43 or other suitable support to provide additional mechanical support for the guiding means of FIG. 2. When cover 40 of FIG. 5 is disposed to encompass system board 1 of FIG. 1, the slots 41 will be in aligned relation with connectors 4 and 4a. Guide rail 28 is slid into frame member 43 and pivot point 22 is connected to pivot 42, while pivot point 45 is connected to pivot 46. In this manner, the card guiding means of FIG. 2 is also aligned with connectors 4 and 4a of system board 1. Guide member 31 is then attached to an adapter card 5 and the entire assembly is slid into guide rail 28 with lever 26 extending outwardly from slot 41. To electrically install the adapter card 5 in the computer system, downward pressure is placed on lever 26 until the electrical tabs 9 of the adapter card 5 are in electrical connection with, for example, lands 10 of connector 4. To remove a card, or change one adapter card for another, the process is reversed. That is, upward pressure is placed on lever 26 and tabs 9 of card 5 are disconnected from lands 10 of connector 4. The card 5 with guide rail 31 is then slid out of guide rail 28 and a new, or replacement card is slid into guide rail 28. Again, downward pressure is exerted on lever 26 to install the new card mechanically and electrically.

It can readily be seen that the present invention let a user change the computer hardware configuration by allowing adapter cards 5, such as a fax/modem, graphics accelerator, or the like, to be installed, or replaced in a computer system without the need for removing the computer cover 40. A computer system user merely needs to electrically isolate, or disconnect the connector 4 from the CPU 2 and then install, remove or replace the adapter card 5. In personal computers, the electrical isolation may include merely powering off the machine, while the card is installed or removed. In more sophisticated systems, it may be necessary to try and isolate the particular connector, or a group of connectors where a new, or different card is to be installed, without electrically disconnecting the remaining connectors.

In most personal computers, workstations and servers the normal procedure for repairing or upgrade action in the I/O subsystem is to turn off the power, open the covers to gain access to the I/O area (connectors 4) and install, remove or replace the adapter card that is bad, or being upgraded. The covers are then replaced and the power restored. In server systems, it is becoming increasingly unacceptable to handle I/O repairing and upgrade actions in this manner, since many users are tied into the server across complex networks and would be shut down during the repair/upgrade action.

Some mainframe and high-end server machines today offer an expensive on-line maintenance capability by providing redundant systems. The present invention provides a relatively inexpensive and simple way to perform on-line maintenance of I/O subsystems which allow I/O cards to be replaced without opening the covers of the computer, and while allowing the system and other parts of the I/O subsystem to continue processing operations.

Figure 6:
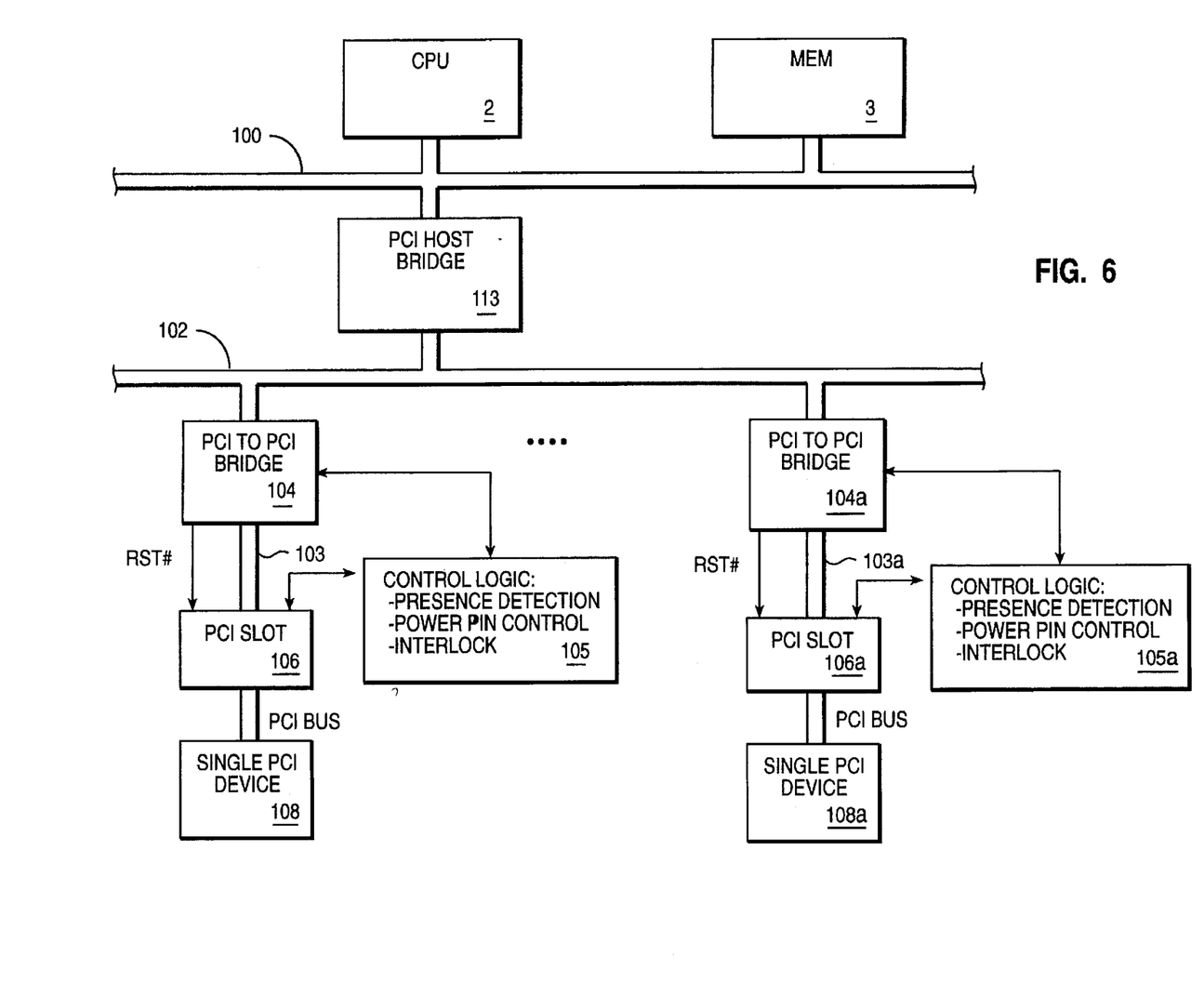
FIG. 6 is schematic diagram of a computer system having a system bus connected to an I/O bus through a host bridge, wherein a number of adapter slots are electrically connected to the I/O bus.

FIG. 6 shows the electrical connections for the various components in an I/O subsystem of the computer system. CPU 2 and memory 3 are shown connected to system bus 100 such as the 60X or 6XX bus available from IBM Corporation. A host bridge chip 113 is shown and provides an interface between system bus 100 and a mezzanine bus 102 used for input/output (I/O), such as the PCI bus. Although FIG. 6 shows a PCI bus and PCI host bridge chip, the present invention contemplates the use of any I/O bus. PCI bridge chip 113 contains logic and functionality that enables the bus protocols to be translated between system bus 100 and bus 102, including interrupt handling, message passing, arbitration, snooping and the like.

Mezzanine bus 102 is connected to at least one PCI to PCI bridge chip 104. This chip provides the interface between the I/O bus and the actual adapter slot 106 which includes a connector 4 and additional logic. Slot 106 will receive an I/O device 108, which may be resident on device 5. The PCI architecture and specifications are available from the PCI Special Interest Group (PCI-SIG), hereby incorporated by reference. The present invention adds additional control logic as shown by reference numeral 105, but does not require modification of the PCI architecture. It should be noted that most computer systems will include more than one I/O slot, as shown in FIG. 6. The additional slots are represented by adding the letter "a" to the reference numerals which are used to describe the components of the present invention.

As noted previously, in order for a system user to install, remove or replace an adapter card, the connector, or slot (including a bank of slots), must be isolated such that all of the processing activity at that slot, or bank of slots is ceased. One way to stop all activity is to merely turn the machine power off. However, this is often not practical for server type machines which interconnect many client computers. This is particularly true in a fault tolerant, or high availability system. Also, with the availability of multitasking systems, it may not be desirable to turn off the power of a single computer, when a particularly important activity is taking place. For example, a personal computer equipped with a fax/modem may need to remain powered on in order to receive a transmission. In this case, it would be advantageous to be able to deactivate a particular I/O slot(s), with the remaining slots being in an active state. The present invention allows a user to replace a particular adapter card without the need of powering off a system, whether it is a server or personal computer.

Figure 7:
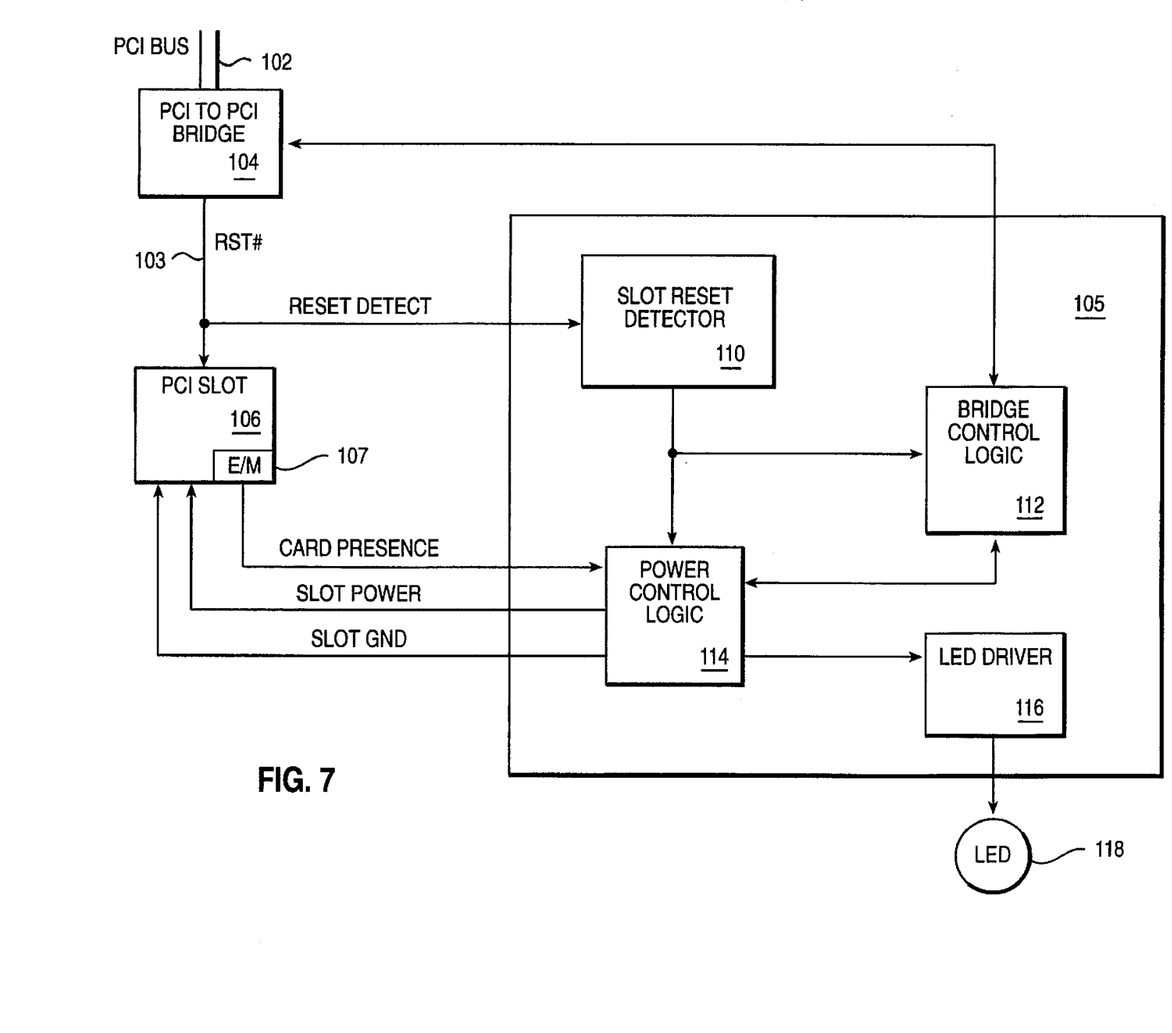
FIG. 7 is a schematic diagram showing the control signals required for operation of the adapter card slot aspect, including a bank of card slots, of the present invention.

FIG. 7 shows the components of the present invention, which allow adapter cards to be installed, removed or replaced, without the need to power off the entire system. The I/O bus 102, e.g. a PCI bus, is connected to a PCI to PCI bridge chip 104, and in combination with the additional control logic 105, is used to control a single PCI slot 106. It should be noted that slot 106 is considered the entire electrical and mechanical functional interface between secondary bus 103 and chip 104. This interface includes connector 4 as one portion, along with various other electrical and mechanical components, such as an electromechanical sensing device 107, as discussed below. One modified bridge chip 104 in conjunction with one set of control logic 105 is used to control one slot 106. Of course, this combination of elements will be replicated according to the number of I/O slots present in the computer system. In this manner each slot can be selectively reset with a RST# signal, and power removed from the slot when an I/O card is to be removed, replaced or installed.

The planar, or system board 1, will be modified to include the bridge chip 104 for each I/O connector 4. The bridge chip 104 is then used to isolate the secondary bus 103 and slot 106 from the remainder of I/O bus 102. When the slot is empty, there is no power applied to the slot, such that a new card can be installed therein. If an I/O card is to be removed, it is first reset to assure that the adapter is not active during removal. The bridge chip 104 will take the slot 106 off-line, and with the aid of additional control logic, remove power from that card at the time it is reset. The card is then mechanically removed, as previously described. Also, electromechanical means, such as a solenoid switch, or the like, can be provided to interlock the I/O card to prevent the card from being removed while power is applied to the slot.

For I/O card insertion, the card is inserted into the machine (the guide means, or the like previously described may be used). Once the card is in place, the system is configured to identify and initialize the new I/O adapter card. Until the newly installed card is configured, the card slot 106 is electrically isolated from the I/O bus 102. When the card is configured, the logic on the planar provides for a ramp-up of power to the power pins on the connector 4. During the upgrade/repair action, only the I/O slot being reconfigured would be affected, allowing the system and other portions of the I/O subsystem to remain in operation. It should be noted that above described operation does not require a change to the PCI (or other I/O bus) specification or architecture itself. That is, the present invention can be totally implemented without any modification to the I/O bus architecture.

Control logic 105, as shown in FIG. 7, includes slot reset detector 110, bridge control logic 112, power control logic 114 and LED driver 116. Also, a light emitting diode (LED) 118 is shown which is controlled by LED driver 116.

The preferred embodiment of FIG. 7 has been described as isolating an individual slot, however, the scope of the present invention includes isolating any number of slots greater than one, i.e. a bank of slots from other slots or banks of slots. By isolating a bank of slots, a single bridge chip 104 can be used to control the bank, thus eliminating the need to provide one bridge chip 104 for each slot 106. Of course, some flexibility is lost when a single chip controls more than one slot, however, this may be desirable in some applications systems where it is desired to reduce system costs and still be able to change cards without deactivating other system functions.

Figure 8:
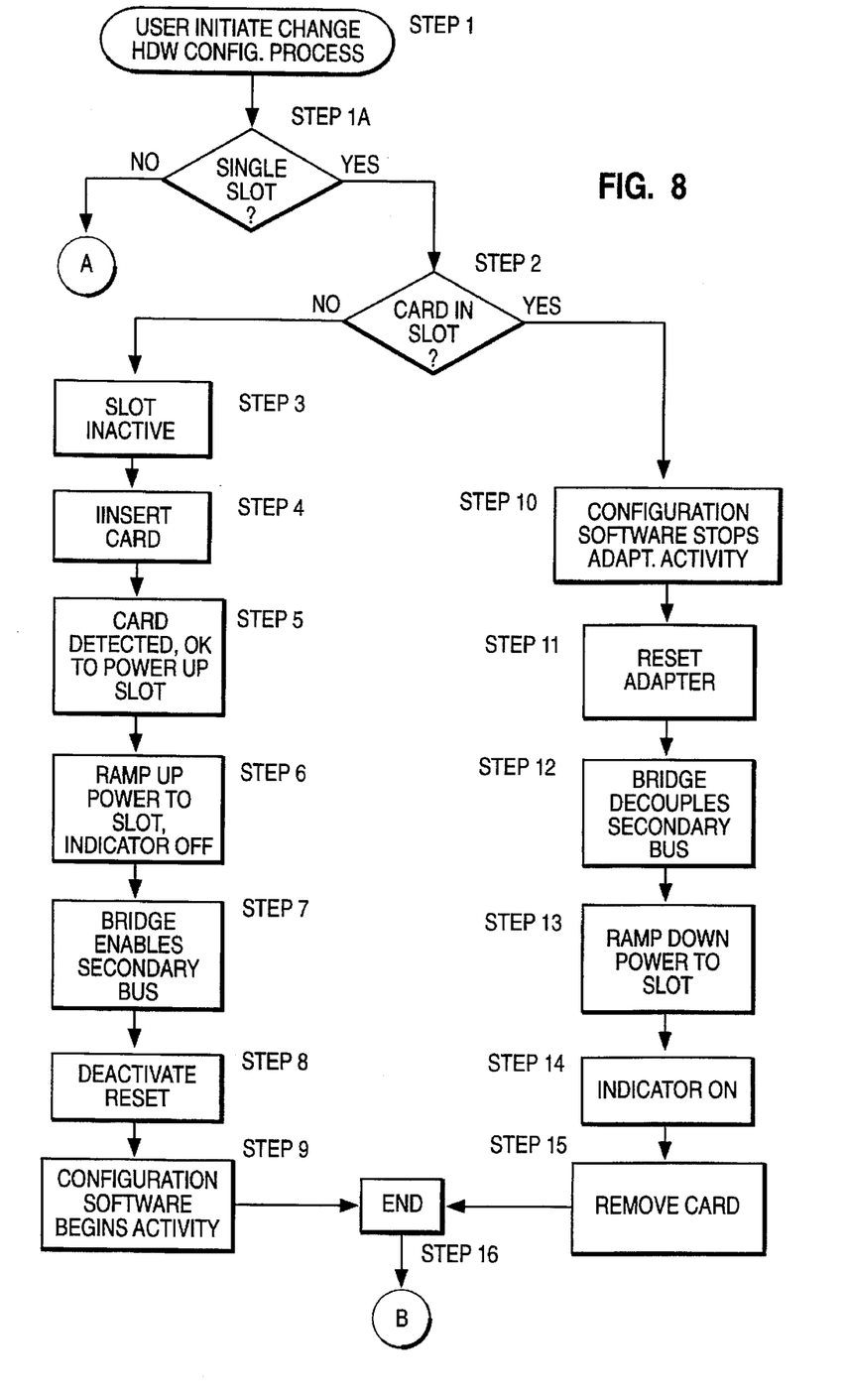
FIG. 8 is a flow chart showing the various process steps implemented by the present invention to hot plug the adapter cards into the I/O slots.

FIG. 8 is a flow chart that will be used in conjunction with FIG. 7 to explain the electrical operation of the present invention.

In a first case, it will be assumed that there is an existing adapter card 5 in a PCI (or other I/O protocol) slot 106 which is to be removed. Referring to FIG. 8, at step 1 the user initiates the process for changing the system hardware configuration by removing, replacing or adding an adapter card. The process then determines whether a single adapter slot, or a bank of slots, controlled by a single bridge chip 104, is present in the system. If a bank of slots are present, then the method proceeds to step 17 of FIG. 13 (discussed below). If, it is determined at step 1a, that a single slot is present, then step 2 determines whether there is a card present in slot 106. Electromechanical sensing device 107 provides the card presence signal to logic 114. In this example, the process will determine that a card exists in slot 106, since it is being assumed that a card is being removed. The user will initiate this process by inputting commands, or the like to the computer system, via a keyboard, mouse, stylus, or other I/O device. These commands may require the user to provide certain information, such as which one of a plurality of slots 106 is to be re-configured, or the like.

At step 10, the operating system, such as the Disk Operating System (DOS), OS/2, AIX, or the like (OS/2 and AIX are trademarks of IBM Corp.) causes all data processing activity between the adapter 5 and the remainder of the computer system to be ceased. Subsequently, a reset RST# signal is issued from bridge chip 104 to the I/O slot 106 (step 11). The RST# signal is also sent to reset detector 110, which in turn transmits a control signal to bridge control logic 112. At step 12, the I/O bridge chip 104 decouples the secondary bus 103 from the primary I/O bus 102. This decoupling is accomplished by a control signal which is sent from bridge control logic 112 to I/O bridge chip 104. Based on the detection of the RST# signal slot reset detector 110 also sends a control signal to power control logic 114, indicating that the power to slot 106 should be gradually reduced (ramped down). The power is then decreased at step 13.

Figure 11:
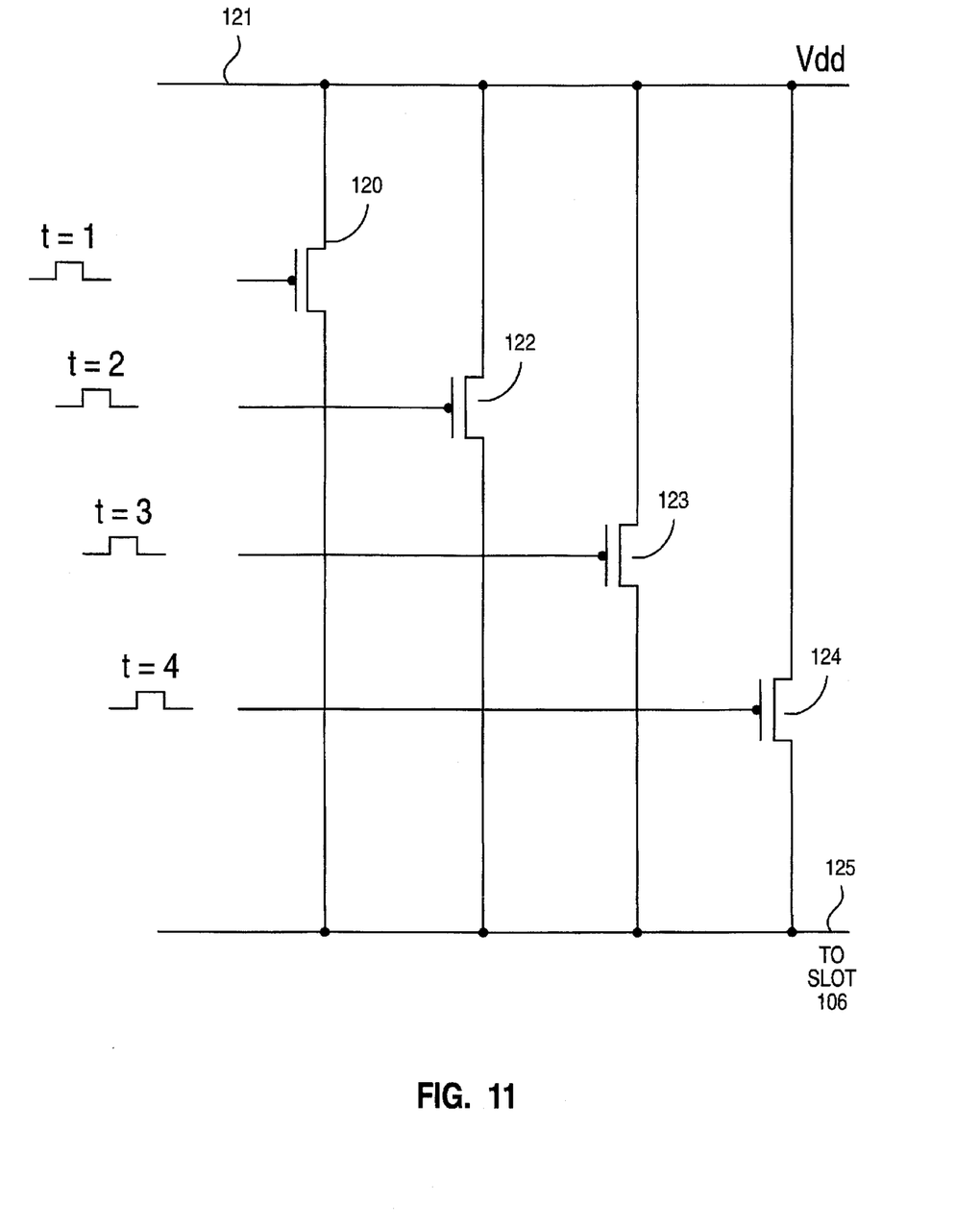
FIG. 11 is a schematic diagram showing one example of a circuit that could be used by the present invention to ramp up or down the power to an adapter card slot.

FIG. 11 shows one embodiment of a circuit which could be used by power control logic 114 to ramp the power to slot 106 up and/or down. The voltage Vdd is shown on rail 121 and connected to N-type transistors 120, 122, 123 and 124 (N-type transistors conduct electricity when a voltage, i.e. logical 1 is applied to their gate). Each of these devices will have a different threshold voltage and present a different resistance when turned on, such that the voltage drop across each of the transistors will be different. In the embodiment of FIG. 11, the devices will be sized where transistor 120 will have a large voltage drop and each of transistors 122, 123 and 124 will have a successively smaller voltage drop. For example, if Vdd is assumed to be 3.3 volts and transistor 120 has a voltage drop of 2.5 volts, then at t=1 the voltage on rail 125 will be Vdd−2.5=0.8 volts. If transistor 122 is sized to give a threshold voltage drop of 1.5 volts, then at t=2, the voltage on rail 125 will be 3.3−1.5=1.8 volts. Assuming for this example that transistor 123 has a threshold voltage of 0.5 volts, then at t=3, the voltage on rail 125 is 3.3−0.5=2.8 volts. And, it will be assumed that transistor 124 has a threshold voltage of substantially 0.0, such that at t=4, the voltage on rail 125 is 3.3−=3.3 volts, or Vdd. Thus, it can be seen how from time t=1 to t=4, the voltage on rail 125, which is connected to slot 106 is gradually increased (ramped up) from 0.8 volts to 3.3 volts. When, it is desired to gradually decrease the power to slot 106 (ramp down), the process is essentially reversed. In the steady state condition, transistor 124 is turned on such that Vdd is provided to slot 106. To decrease the voltage on rail 125, transistor 124 is turned off by removing the voltage from its gate, and transistor 123 is turned on. Thus, 2.8 volts is then on rail 125, due to the threshold voltage of 0.5 volts from device 123. During the next time period, transistor 123 is turned off and device 122 is turned on, and a voltage of 1.8 volts will be on rail 125 because of the 1.5 volt threshold of device 122. Next, transistor 122 is turned off and transistor 120 is turned on placing a voltage of 0.8 volts on rail 125 due to the 2.5 volt threshold of transistor 120 (step 13). Of course, those skilled in the art will easily understand how the pulses at t=1 to t=4 can be varied by a clock generation circuit, and that additional transistors can be added to provide a more gradually sloping transition at slot 106 from no power (voltage=0) to fully powered (voltage=Vdd). Typical devices in slot 106 may require the voltage to be powered down to 0.2 volts. Those skilled in the art will understand how a wide range of voltage levels can be achieved with the circuit of FIG. 11.

Further, power control logic 114 receives a confirmation signal from bridge control logic 112 that indicates slot 106 has actually been decoupled from the I/O bus 102. This will prevent any damage, data loss, or the like that could occur due to removing an actively coupled I/O card. A card presence signal is also provided from slot 106 to power control logic 114 which confirms that there actually is a card 5 in slot 106. Once the power has been removed from slot 106, a signal is sent from power control logic 114 to LED driver 116, which in turn energizes LED 118 (step 14), thereby indicating to a user that the slot has been decoupled from the bus, the slot has been de-energized and the card can now be removed (step 15) in accordance with the previously described mechanical guide means, or the like (FIGS. 1–5). In one preferred embodiment, electromechanical device 107, such as a relay, solenoid switch, or the like, can be used to physically prevent the card from being removed unless it has been powered down. Subsequent to step 15 the process of removing an adapter card from an I/O slot ends at step 16. It should be noted that those skilled in the art will understand there are many different implementations of control logic 105, and the present invention is not limited by any one particular implementation. For example, any portion of the external control logic 105 could be incorporated into the PIC to PCI bridge chip 104, although additional I/O pins on bridge chip 104 would be required.

In the second example, it will be assumed that a card is being inserted into a slot on a computer system. In this case, the card to be inserted is either new, or is replacing another adapter card which has been removed in accordance with steps 10–15. Therefore, at step 2 it is determined that there is not an adapter card 5 in connector 4 of slot 106. Step 3 then ensures that the power has been removed from slot 106, as indicated by LED 118, and the fact that a new card 5 cannot be physically inserted into a slot, due to the electromechanical device 107, if there is power applied to the slot. At step 4, the new adapter card 5 is inserted into connector 4 of slot 106, using the mechanical apparatus of the present invention as described in conjunction with FIGS. 1–5. Electromechanical device 107 will then issue the card presence signal to power control logic 114, thereby indicating that new card 5 is physically present in slot 106 (step 5). Receipt of the card presence signal by logic 114 indicates that electrical power can now be gradually applied to slot 106 through the slot power and slot ground power distribution lines using apparatus such as previously described in accordance with FIG. 11 (step 6). Once slot 106 is powered up, the power control logic 114 then provides a control signal to LED driver 116 which causes the LED to be turned off indicating to the user that power is now applied to the slot and the card cannot be removed. At step 7, the power control logic issues a connect bus control signal to bridge control circuit 112, which in turn sends an enable signal to the I/O bridge chip 104, thus causing secondary bus 103 to be coupled with the primary I/O bus 102. The RST# signal from bridge chip 104 is then deactivated at step 8. At this time the new card 5 is physically present in connector 4, with the power applied to slot 106, and the secondary bus 103 connected to I/O bus 102. All that remains is for the software in the computer system to begin configuration activity, such as determining what type of card has been installed and type of protocol it uses (step 9). The configuration software may read a read only memory (ROM) on the adapter card to make these determinations. Subsequent to configuration, data processing activity using the new card can begin. The installation process is then complete and the method of FIG. 8 ends at step 16.

Figure 12:
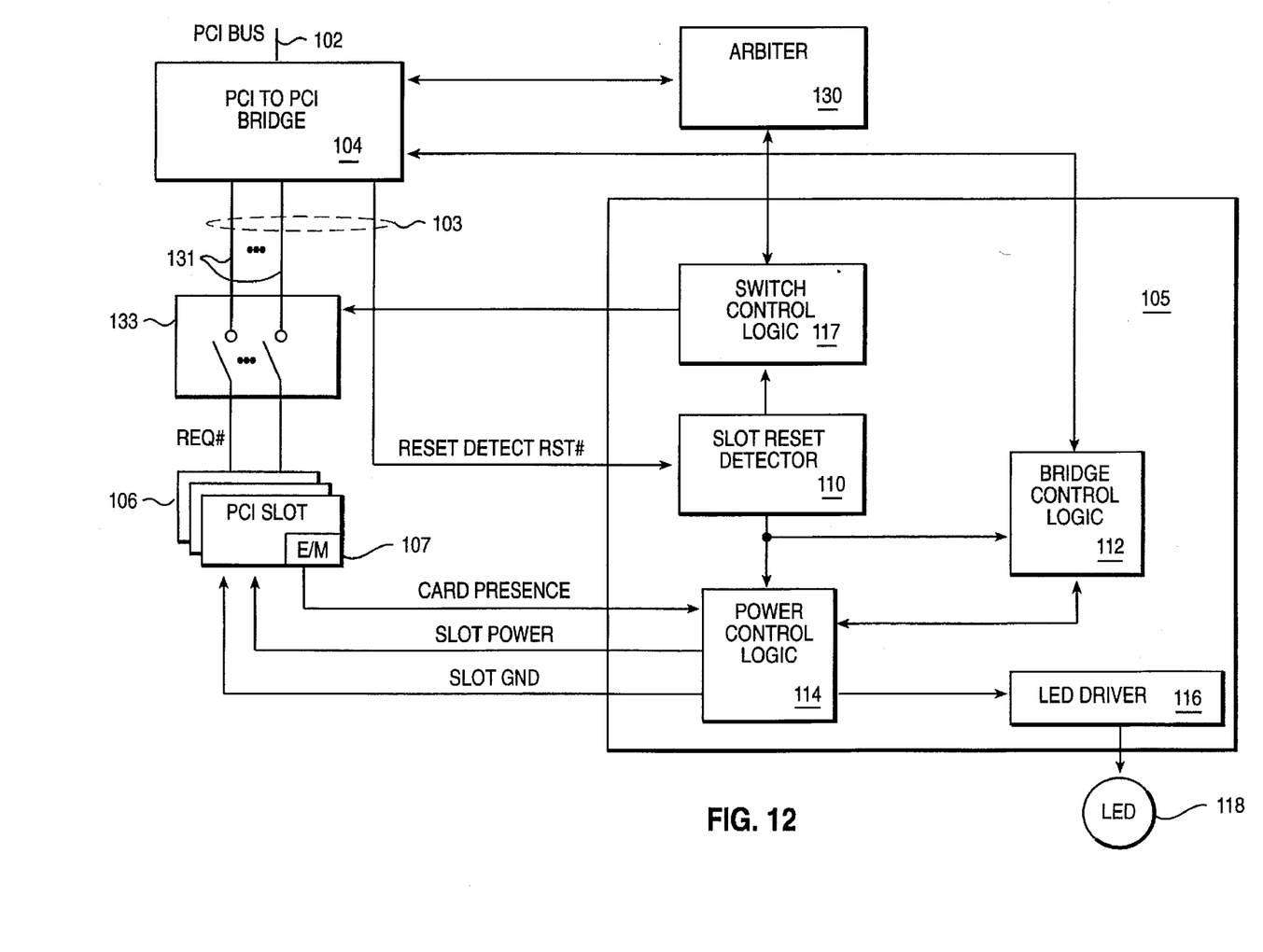
FIG. 12 is a block diagram illustrating one preferred embodiment of the present invention wherein a bank of slots can be deactivated to install, remove or replace a card without requiring the entire system to be taken off line.

FIG. 12 shows a block diagram of an embodiment of the present invention wherein a bank of slots 106 are controlled by a single bridge chip 104. These slots can then be controlled, i.e. deactivated, as a group. Reference numerals in FIG. 12 corresponding to the same numerals used in FIG. 7 are intended to represent identical components and will not be discussed again. It can be seen that reset detector 110 provides a control signal, based on reset signal RST# to an arbiter 130. This arbiter is a standard logic device which receives requests for ownership of the secondary bus 103 and then awards the bus to the bridge chip 104, or one of the slots 106, based on a set of predetermined criteria, e.g. the device which least recently had access to the bus. Arbiter 130 is shown as being connected to bridge chip 104, but is also connected to each slot 106 through the bridge chip. Request lines 131 are shown which transmits a bus request signal from slots 106 to arbiter 130, via bridge chip 104. Those skilled in the art will understand that bus 103 contains many other control signal lines, such as an arbitration grant line, and the like which indicates to a particular slot that the bus has been awarded to a particular slot subsequent to an arbitration cycle. Other lines accommodating data and address signals are also included in bus 103, but not shown in FIG. 12. A set of in line switches 133 are placed in request lines 131 and controlled by switch control logic 117. It should be noted that there will be one set of switches for each slot present in the bank. Upon detection of the RST# signal from bridge chip 104, switch control logic 117, sends a control signal to arbiter 130 which then awards ownership of bus 103 to bridge chip 104. This ensures that none of the slots 106 in the bank have ownership of the bus 103 when the process of deactivating the bank of slots is initiated. Concurrently, with the signal sent to arbiter 130, switch control logic 117, also sends a control signal to switches 133, which opens the switches, thus, preventing any of the cards in the slots 106 from requesting access to bus 103 and initiating an arbitration cycle. Once arbitration is disabled, then the bank of slots 106 can be deactivated using the same techniques described above with regard to FIGS. 7 and 8.

Figure 13:
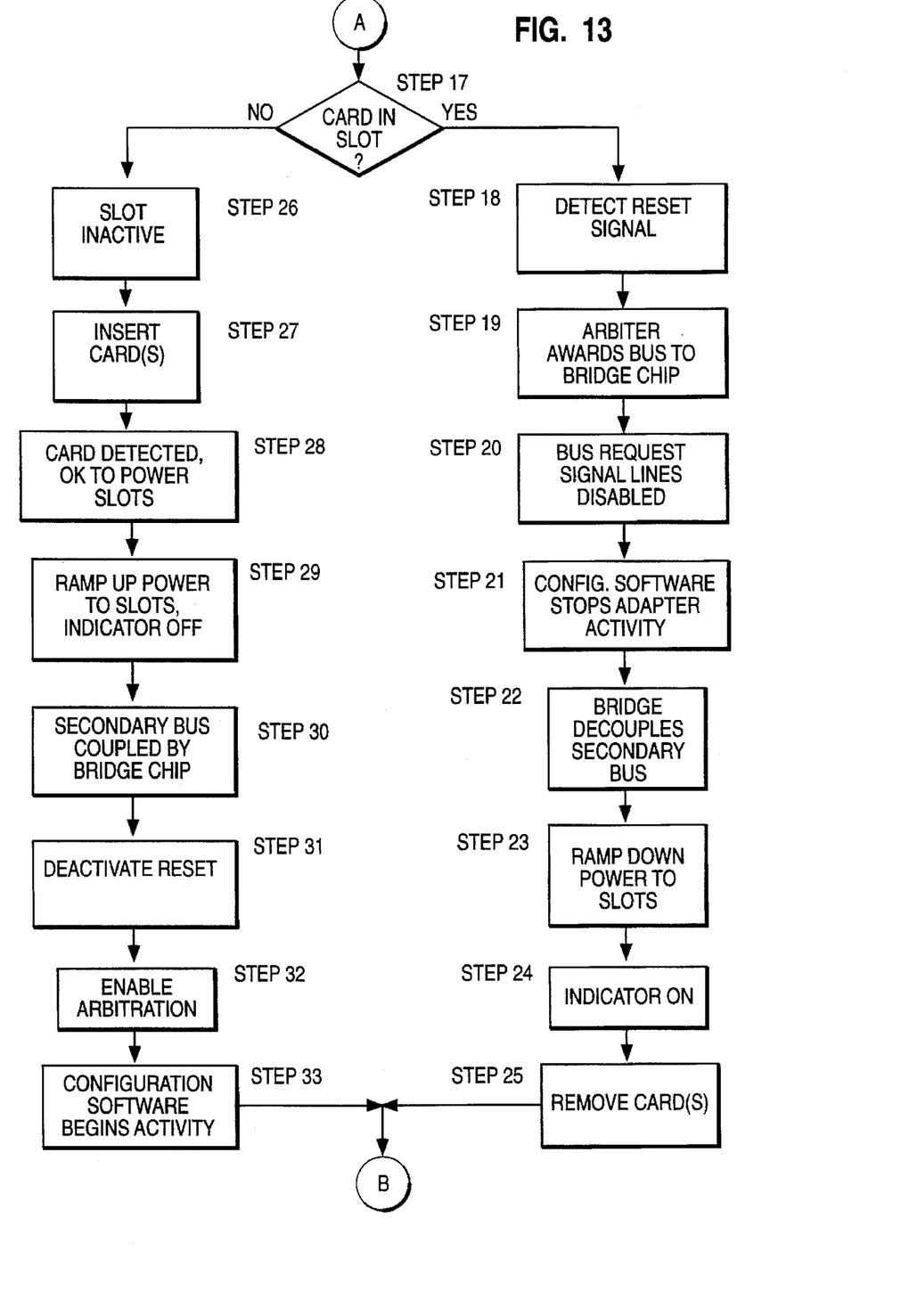
FIG. 13 is a flow chart showing the steps needed to remove, install or replace the cards in a bank of slots.

The flowchart of FIG. 13 will now be described in conjunction with FIG. 12. If at step 1a of FIG. 8 determines that a bank of slots is present in the computer system, then step 17 of FIG. 13 determines if the card, or cards, to be removed or replace is one of the slots in the bank. If so, then at step 18 slot reset detector 110 provides a control signal to switch control logic 117, which in turn provides a signal to arbiter 130. At step 19, arbiter 130 awards ownership of bus 103 to bridge chip 104. Switch control logic 117 then disables bus request signal lines 131 by opening switches 133 (step 20). At step 21 the configuration software stops activity to the feature cards in slots 106. Bridge chip 104 then decouples secondary bus 103 from I/O bus 102 at step 22. The power to the bank of slots is then gradually decreased at step 23. At step 24, LED 118 indicates when the power is removed from slots 106, and the card, or cards can then be removed (step 25).

If at step 17, it is determined that a card is to be inserted into one of the slots 106 in the bank, then the slots in the bank will be inactive (step 26) since the bank has previously been deactivated in accordance with steps 18–25. At step 27 the card(s) 5 to be added to the computer system are inserted into connector(s) 4. Electromagnetic switch(es) 107 then indicates the presence of the card(s) (step 28). The power to the bank of slots is then gradually increased at step 29 and an indication is given that bus 103 can be coupled to I/O bus 102 by bridge chip 104. At step 30, bridge chip 104, then reconnects secondary bus 103 to I/O bus 102. The reset signal is deactivated at step 31. This causes the switch control logic to enable arbitration for bus 103 by closing switches 133 (step 32). The configuration software for each card in the bank of slots allows the card(s) 5 in the bank of slots to begin data processing activities (step 33). Subsequent to both steps 25 and 33, the process continues to step 16 (FIG. 8) and ends.

In computer systems having a particular type of I/O bus, such as the PCI bus, it is impossible (in some cases) to report errors which occur on the I/O bus and allow for recovery from those errors. For example, address parity errors are reported with a system error signal (SERR#). This signal will generate a non-maskable interrupt (NMI) signal to the central processing unit. A problem arises because in many systems, an NMI is non-recoverable and any error reported with an NMI will cause the computer system to be restarted. That is, there is no error recovery code for NMIs and the computer system must go through its initial program load (IPL) in order to resolve the error condition. This is undesirable in computer systems, such as servers, where re-IPL of the system will cause all of the client systems connected to the server to also be restarted. In this case, even those client systems which are error free will have to be re-IPLed, since the server machine will respond to the NMI with a machine check.

Additionally, client systems, such as personal computers which have multiple feature cards in various slots will be adversely affected if one of the feature cards, or devices issues a NMI. That is, if a single card issues a NMI to the CPU, the only recourse is for the CPU to re-IPL. This is because the CPU is unable to identify which feature card has the error condition which cause the NMI to be issued.

Further, the SERR# signal is sometimes driven by devices (i.e. cards) to indicate that an unserviceable internal error condition exists. Typically, the SERR# signal for various devices is ORed together with other SERR# signals, such that the CPU does not know which device has initiated the signal, why it has been issued, or if there is more than one device issuing a SERR# signal. Another example of an unrecoverable error is substantially all errors which occur when the operation being performed has been posted by a slave device (adapter card) for future completion by a master (CPU), and the master does not complete the operation. This type of error applies to all programmed I/O (PIO) operations (via load and store instructions), used in conjunction with many different types of commercially available microprocessors, which are destined for the PCI memory address space. Thus, the system software can write data to an I/O device, e.g. a PCI device, and since the operation completes successfully on the processor bus, the software program continues operations. Any error that subsequently occurs on the PCI bus will then be too late for the software to correct the problem.

In another embodiment of the present invention the I/O protocol can be altered to a minor extent in order to allow recovery of errors on a PCI (or other similar I/O bus) bus. In order for this error recovery to be possible, each slot must be isolated such that the CPU can determine the type of error and which card is issuing the error signal.

Figure 9:
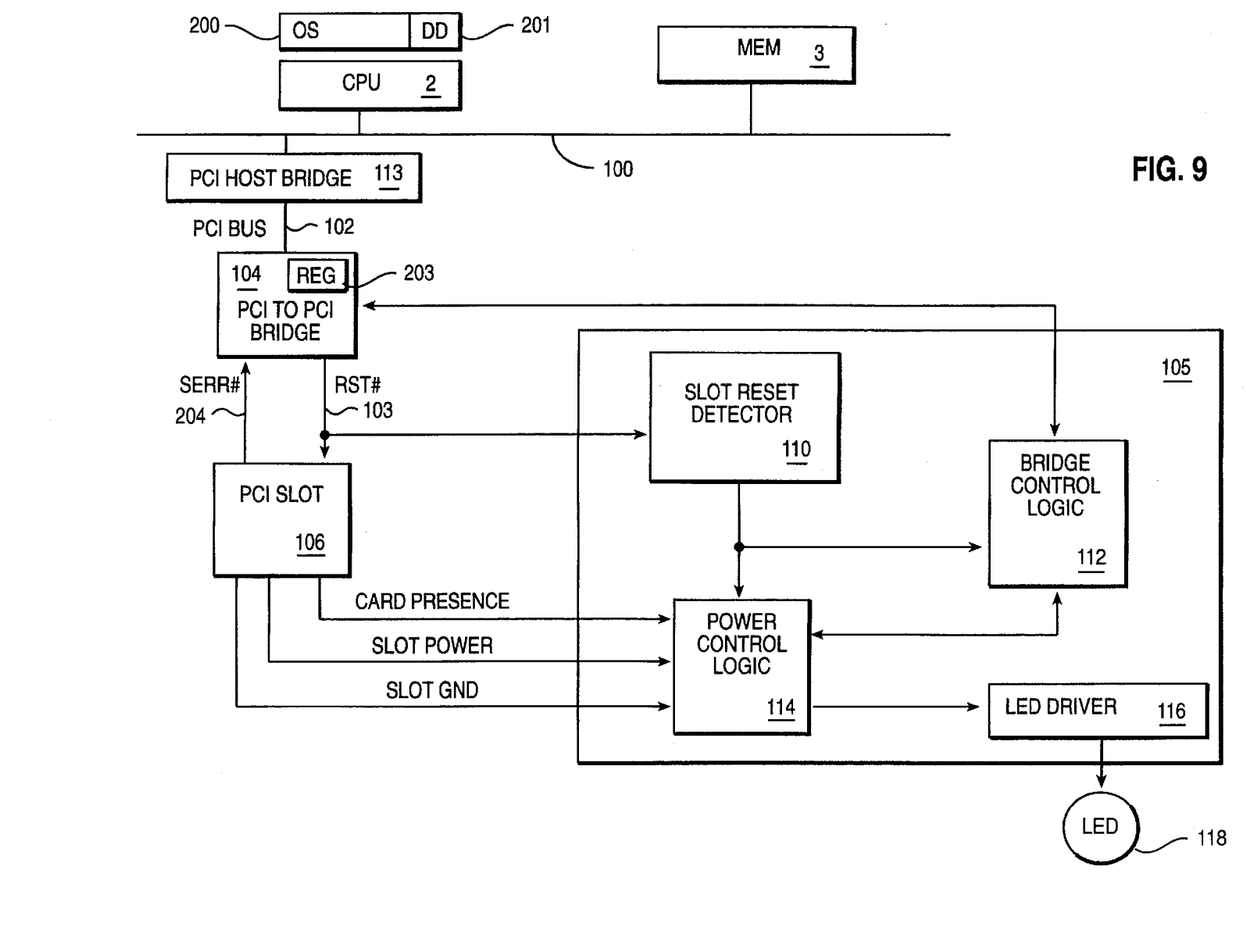
FIG. 9 is a schematic diagram illustrating the control signals required for another aspect of the present invention wherein the I/O adapter slots are isolated to provide enhanced error recovery.

FIG. 9 is a block diagram of a preferred embodiment of the error recovery aspect of the present invention. It should be noted that components referred to by numerals in FIG. 9 correspond to the same components used in FIGS. 7 and 12 and will not be discussed again. In FIG. 9, system bus 100 connects CPU 2 and memory 3 to bridge chip 113. CPU 2 has a software operating system 200, such as the AIX or OS/2 operating system. Also device drivers 201 are installed on CPU 2, and may be included in operating system 200. These device drivers 201 are used to control the various components, including the feature cards 5 in slots 106, of the computer system. Device drivers 201 performs such functions and communications, error detection and correction, and the like. I/O host bridge chip 113 is connected to system bus 100 and also to I/O bus 102. Bridge chip 104 is then connected to I/O bus 102 and slot 106. In the currently described embodiment, at least one additional register 203 is added to bridge chip 104 for storing status information. Further, it can be seen from FIG. 9 that signal line 103 is used to transmit the reset signal RST# to slot 106. And, signal line 204 will provide the SERR# signal from slot 106 to bridge chip 104. The remainder of the components in FIG. 9 are identical to those shown in FIG. 7, and described in accordance therewith.

The key to the error recovery scheme is to isolate each I/O device, i.e. each I/O slot 106, from the primary I/O bus 102 with a modified bridge chip 104. In this preferred embodiment a modification to the previously referenced PCI to PCI implementation is necessary. More specifically, a recovery mode configuration bit is added that will be set when any error condition is present on a particular one of the cards in a slot 106. When the recovery mode configuration bit is set, the RST# signal will be activated and held, in order to keep the device 5 in its reset state to prevent any damage from being caused to the system, as described above. Further, a status bit in register 203 is set to signal an external interrupt to the system. Also, when the configuration bit is set any further loads or stores from the CPU 2 to the device are ignored by throwing away any data from the CPU on a store, and returning a value of all logical ones on any load operation. Finally, any direct memory access (DMA) data from the device 5 is discarded and any operation that would pass on the DMA data are aborted.

The device driver 201 has responsibility for checking the status of any I/O operations at either the bridge chip 104, or the device itself to make sure that the operation is completed correctly at specific points in the code (instructions being executed). Register 203 will contain some bit where, e.g. a logical 0 will indicate that there is no error present and the device driver can read the information from the I/O device. However, if the status bit in register 203 contains a logical 1 and the bridge chip 104 is holding device 5 in the reset state (RST# active), then when the device driver reads the information from the device all the bits will be set to logical ones, thus, indicating to the driver that the operation did not complete properly. It should be noted that errors on the primary I/O bus 102 will still generate a machine check, causing a re-IPL of the system. However, by using the isolation methodology of the present invention the primary I/O bus 102 does not have any slots 106 directly connected to it, thus dramatically increasing its reliability.

Further, the computer system can be designed so that only specific ones of the devices 5 will participate in this "reset" type of error recovery. When the error recovery of this embodiment is not turned on, then errors are passed on from the devices to the primary I/O bus 102, with the result that a machine check will probably be generated. It may be acceptable for certain systems to be designed wherein only the critical devices (e.g. DASD and LAN adapters in server systems) which handle the majority of data in the system need to be modified to take advantage of the error recovery scheme of the present invention. In this manner, the reliability of the system can be greatly increased without the need for modifying the entire computer system.

Figure 10:
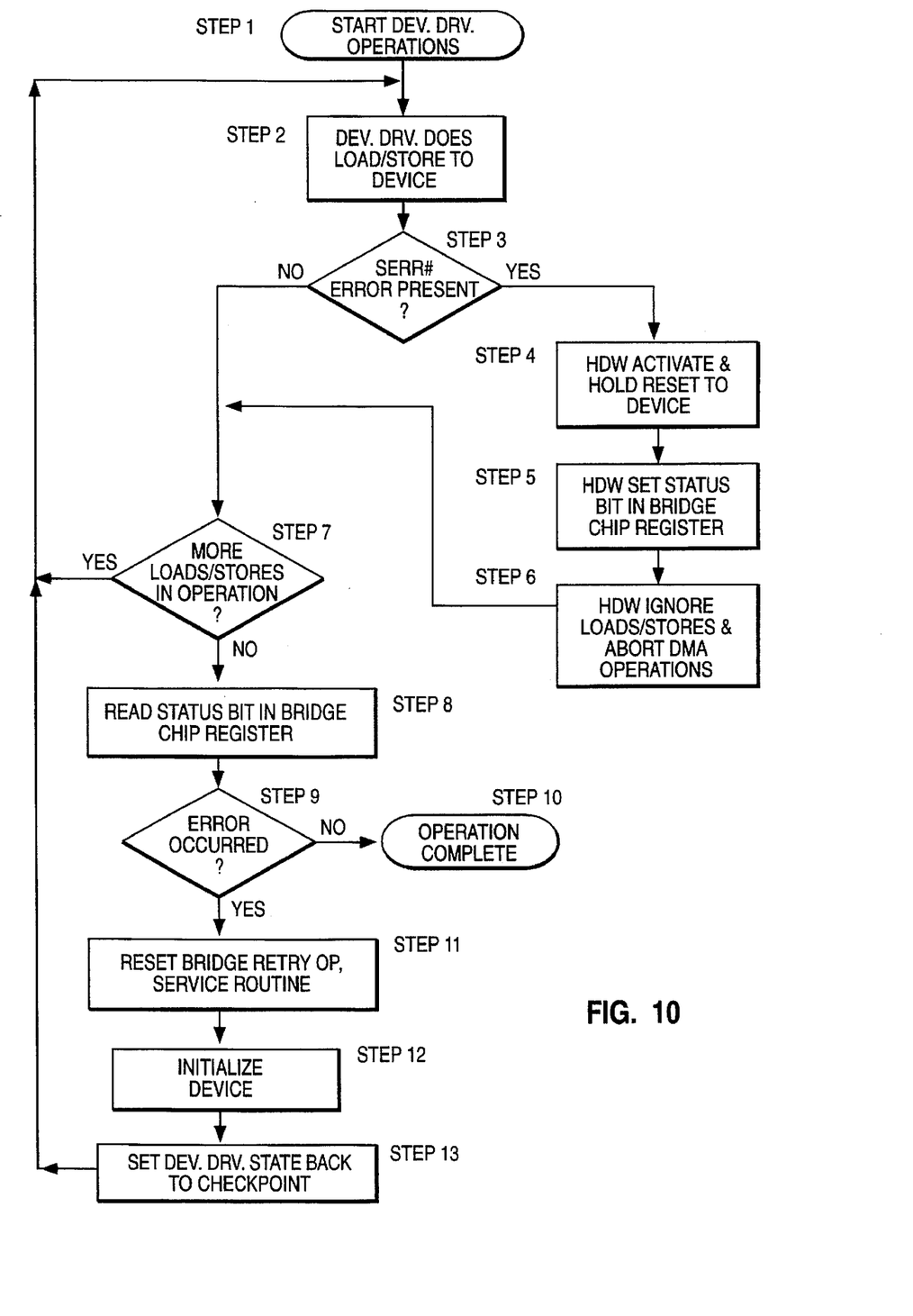
FIG. 10 is a flow chart of the steps needed to implement the error recovery aspects of the present invention.

FIG. 10 is a flow chart showing the steps implemented by the error recovery aspect of the present invention. At step 1 the process is started and at step 2 the device driver performs any load/store operations to the the device being controlled. It should be noted that the present invention also addresses the situation wherein a string, or related group, of load/store operations are to be implemented. Step 3 then determines whether an SERR# signal is present from one of the plurality of devices on the adapter cards in the computer system. If so, then at step 4, the reset signal RST# is activated (by bridge chip 104) to the device signaling SERR#, to place the device 5 in its reset state and avoid any damage to the system, while still keeping the device coupled to the system. That is, the slot 106 having the feature card which issued the SERR# signal is reset in the manner as previously described (data processing activity is ceased). At step 5, the status bit in register 203 is set, e.g. to logical 1. Next, at step 6, the control hardware as shown in FIG. 9 will ignore all load and store operations, and abort any pending direct memory access (DMA) operations. If at step 3 it was determined that there was no SERR# present, then the process of the present invention continues to step 7 where it is determined if there are additional load and store operations in the string of instructions being implemented. If there are additional load and/or stores, then the process loops back to step 2 where the device driver implements the load/store. If there are no additional load/store operations, then at step 8 the device driver reads the status bit in register 203 of bridge chip 104. Step 9 then determines if an error condition has occurred. If at step 5, the status bit was not set to indicate that an SERR# error has occured, then the load/store operations in considered to have completed (step 10). However, if at step 5 the status bit was set to indicate the presence of an SERR# signal, then bridge chip 104 is reconfigured (by re-initialization) at step 11. Typically, the device driver will reset the feature card by re-initializing the device. However, the present invention contemplates that the device driver may also attempt a retry operation that would tell the bus master device which is attempting to transfer information between itself and the device to attempt the transfer operation again. If the error condition has been removed, then the load/store operation may be implemented correctly. Further, at step 11, the device driver may call one or more service routines which will attempt to correct the error condition in the device. These error routines may reside in computer's read only memory (ROM) as part of the power on self test (post) code, or the like. However, the typical situation is for the device driver to re-initialize the device having the error condition. In accordance with the present invention, only the particular device which actually generates the error code with be re-IPLed. The remaining devices on the plurality of feature cards in the computer system will continue normal data processing activities. Thus, it can be seen how the present invention allows a computer system to isolate a single device in a particular I/O slot 106, without affecting the operations of other devices on other cards 5 in different slots.

At step 12, the particular device generating the error code is then re-initialized by the device driver. The device driver is then set back to a checkpoint state for normal data processing activies (step 13). That is, the device driver has initialized the device and is controlling its activities in a normal manner, e.g. by implementing load and store operations to transfer information between itself and the device being controlled. This also includes determining when an SERR# signal has occurred in the device being controlled, as shown by step 3. It can be seen that subsequent to step 13 the process loops backs to step 2 and continues.

It can be seen how the present invention will greatly improve reliability by allowing error conditions to be corrected on individual feature cards, without the need to power down the entire computer system.

Although certain preferred embodiments have been shown and described, it should be understood that many changes and modifications may be made therein without departing from the scope of the appended claims.

We claim:

1. A computer having a system board with at least one connector having electrical connection lands, comprising:

a cover that encloses said system board, including at least one slot aligned with said connector;

a feature card having insertion tabs, disposed on one side thereof, for contacting said lands;

a support member affixed to a side of said feature card opposite said insertion tabs; and means for inserting said feature card to said connector, or removing a feature card from said connector, without removing said cover, said means for inserting including a frame member aligned with said slot and connector, affixed to said computer and disposed inside said cover, and means for receiving said support member which are rotatingly attached to said computer system.

2. A computer according to claim 1 wherein said frame member further comprises:

means for applying a force to said feature card in a direction toward said at least one connector, said means for applying extending through said at least one slot.

3. A computer according to claim 2 wherein the direction of said force is substantially perpendicular to the longitudinal axis of said at least one connector.

4. A computer according to claim 3 wherein said means for receiving accommodates feature cards of variable dimensions.

5. A method of changing the hardware configuration of a computer having a system board with at least one connector having electrical connection lands, comprising the steps of:

providing a cover that encloses said system board including at least one slot formed therein aligned with said connector;

providing a feature card having insertion tabs, disposed on one side thereof, for contacting said lands;

supporting said feature card with a support member affixed to an edge of said feature card opposite said insertion tabs;

inserting said feature card into said connector or removing a feature card from said connector, without removing said cover by affixing a frame member to said computer inside said cover which is aligned with said slot and connector, and by receiving said support member in said frame member wherein said support member is rotatingly attached to said computer system.

6. A method according to claim 5 wherein said step of inserting further comprises the steps of:

applying a force to said feature card in a direction toward said at least one connector; and extending at least a portion of said frame member through said at least one slot for access by a user of said computer.

7. A method according to claim 6 wherein the direction of said force is substantially perpendicular to the longitudinal axis of said at least one connector.

* * * * *